(12) United States Patent
Itazaki et al.

(10) Patent No.: US 11,143,827 B1
(45) Date of Patent: Oct. 12, 2021

(54) LIGHT RECEIVING ELEMENT UNIT

(71) Applicant: KYOTO SEMICONDUCTOR CO., LTD., Kyoto (JP)

(72) Inventors: Yu Itazaki, Kyoto (JP); Etsuji Omura, Kyoto (JP)

(73) Assignee: Kyoto Semiconductor Co., Ltd., Kyoto (JP)

( * ) Notice: Subject to any disclaimer, the term of this patent is extended or adjusted under 35 U.S.C. 154(b) by 0 days.

(21) Appl. No.: 15/734,103

(22) PCT Filed: Aug. 3, 2020

(86) PCT No.: PCT/JP2020/029673
§ 371 (c)(1),
(2) Date: May 6, 2021

(51) Int. Cl.
*G02B 6/42* (2006.01)
*H01L 25/04* (2014.01)

(52) U.S. Cl.
CPC ......... *G02B 6/4214* (2013.01); *G02B 6/4243* (2013.01); *H01L 25/043* (2013.01)

(58) Field of Classification Search
CPC .... G02B 6/4214; G02B 6/4243; H01L 25/043
USPC .......................................................... 385/31
See application file for complete search history.

(56) References Cited

U.S. PATENT DOCUMENTS

| | | | | |
|---|---|---|---|---|
| 5,276,329 A * | 1/1994 | Hughes | ................. | G01T 1/2018 250/370.09 |
| 5,679,947 A * | 10/1997 | Doi | ....................... | G11B 7/127 250/201.5 |
| 5,793,790 A * | 8/1998 | Doi | ...................... | G11B 7/0901 372/50.1 |
| 6,071,426 A * | 6/2000 | Lee | ........................ | G02B 6/122 216/2 |
| 6,399,968 B2 | 6/2002 | Kato et al. | | |
| 6,406,196 B1 * | 6/2002 | Uno | ................... | G02B 6/12007 385/47 |
| 6,483,098 B1 | 11/2002 | Kato et al. | | |
| 9,312,960 B1 * | 4/2016 | Feng | ........................ | H04J 14/02 |
| 2002/0136256 A1 * | 9/2002 | Hamasaki | ............. | G11B 7/1263 372/50.21 |
| 2005/0226636 A1 * | 10/2005 | Hiramatsu | .......... | H01S 5/02234 398/182 |
| 2006/0061674 A1 * | 3/2006 | Iida | ..................... | H01L 27/1463 348/308 |

(Continued)

FOREIGN PATENT DOCUMENTS

| | | |
|---|---|---|
| CN | 107516684 A | 12/2017 |
| JP | 11-284219 A | 10/1999 |

(Continued)

*Primary Examiner* — Kaveh C Kianni
(74) *Attorney, Agent, or Firm* — Norris McLaughlin, P.A.

(57) ABSTRACT

An edge incident type light receiving element unit capable of receiving optical signals in different wavelength ranges incident from the edge side comprises a first light receiving element for receiving optical signals in a first wavelength range and a second light receiving element for receiving optical signals in a second wavelength range, and configured so that optical signals transmitted through a first light receiving portion formed vertically on a wall portion of a first semiconductor substrate incident via a reflecting portion on a second light receiving portion formed on a second semiconductor substrate fitted on the first semiconductor substrate.

4 Claims, 6 Drawing Sheets

(56) References Cited

U.S. PATENT DOCUMENTS

| | | | | |
|---|---|---|---|---|
| 2008/0012029 A1* | 1/2008 | Schranz | ............... | H01L 27/15 |
| | | | | 257/88 |
| 2010/0017922 A1* | 1/2010 | Shin | ............... | G01Q 60/22 |
| | | | | 850/21 |
| 2011/0096218 A1* | 4/2011 | Bratkovski | ............ | H04N 5/335 |
| | | | | 348/302 |
| 2011/0158273 A1* | 6/2011 | Okayama | ............ | H01L 24/97 |
| | | | | 372/43.01 |
| 2011/0315858 A1* | 12/2011 | Heck | ............... | G02B 6/4214 |
| | | | | 250/214 A |
| 2013/0094074 A1* | 4/2013 | Asghari | ............ | H01S 5/02326 |
| | | | | 359/341.1 |
| 2016/0307939 A1* | 10/2016 | Wang | ............ | H01L 31/035281 |
| 2016/0373191 A1* | 12/2016 | Fathololoumi | ...... | H04B 10/503 |
| 2018/0180829 A1* | 6/2018 | Gudeman | ........... | H01S 5/02255 |
| 2019/0006550 A1 | 1/2019 | Fujii | | |
| 2019/0172868 A1* | 6/2019 | Chen | ............... | H01L 27/14625 |
| 2019/0288132 A1* | 9/2019 | Wang | ............... | H01L 31/0232 |
| 2020/0168749 A1* | 5/2020 | Nishimura | ........... | G02B 6/4214 |
| 2020/0220036 A1* | 7/2020 | Azize | ............ | H01L 31/035281 |
| 2020/0278426 A1* | 9/2020 | Dummer | ............... | G01S 7/4815 |
| 2020/0295218 A1* | 9/2020 | Wakano | ............... | G01S 17/93 |
| 2021/0167232 A1* | 6/2021 | Cardwell | ........... | H01L 31/02327 |

FOREIGN PATENT DOCUMENTS

| | | |
|---|---|---|
| JP | 2000-183390 A | 6/2000 |
| JP | 2002-33503 A | 1/2002 |
| JP | 2004-319916 A | 11/2004 |
| JP | 2011-192873 A | 9/2011 |
| JP | 2019-012713 A | 1/2019 |
| JP | 6711985 B1 | 6/2020 |
| WO | 2019/043864 A1 | 3/2002 |

* cited by examiner

LIGHT RECEIVING ELEMENT UNIT

TECHNICAL FIELD

The present invention relates to a light receiving element unit including two light receiving elements having different wavelength ranges for receiving light signals in order to convert optical signals in different wavelength ranges into electric signals. In particular, the present invention relates to a light receiving element unit in which the light receiving elements receive optical signals incident from an optical fiber cable fixed to the edge side thereof.

BACKGROUND ART

In the field of optical communication, optical signals are transmitted via an optical fiber cable, and a light receiving element that receives the optical signals converts them into electric signals and outputs the signals to transmit information. The optical fiber cable is fixed to, for example, a V-groove having a V-shaped cross section formed on a mounting board of the light receiving element so that it can be precisely aligned with the light receiving element. In this case, since the optical signals are emitted from the output end of the optical fiber cable in parallel with the mounting board, for example, an edge incident type semiconductor light receiving element as in Patent Document #1 is used.

On the other hand, in order to increase the amount of communication in one optical fiber cable, optical signals in different wavelength ranges are simultaneously transmitted in the same optical fiber cable. In order to receive the light signals in different wavelength ranges, it is known that a plurality of light receiving elements having different wavelength ranges are arranged side by side, and a spectroscopic mechanism disperses the incident light according to the wavelength and make the light incident in the corresponding light receiving element.

Since a plurality of light receiving elements are arranged side by side, the area becomes large and a spectroscopic mechanism is also required. Therefore, it is not easy to form a small light receiving element unit suitable for incorporation in an optical communication device. Therefore, for example, as in Patent Documents #2 to #4, by arranging two light receiving portions that receive optical signals in different wavelength ranges so as to overlap each other in the incident direction of the optical signals from the optical fiber cable, a small light receiving element or a small light receiving element unit that does not require a spectroscopic mechanism has been proposed.

PRIOR ART DOCUMENTS

Patent Documents

Patent Document #1: Japanese Laid-open Pat. Publication 2000-183390.
Patent Document #2: Japanese Laid-open Pat. Publication 2011-192873.
Patent Document #3: Japanese Laid-open Pat. Publication 2019-12713.
Patent Document #2: Japanese Patent Publication 6711985.

SUMMARY OF THE INVENTION

Problems to be Solved by the Invention

In the light receiving element unit as in Patent Documents #2 to #4, optical signals are normally incident on the light receiving portion formed on a main surface side of a semiconductor substrate. Therefore, in order to receive the optical signals from the optical fiber cable fixed to the V-groove of the mounting board, it was necessary to fix the light receiving element unit in a vertical position on the mounting board so that face toward the optical fiber cable by using a sub-board or the like. Further, since the electric signals are taken out from the vertically standing light receiving element unit, it is difficult to connect the light receiving element unit and the wiring on the mounting board by wire bonding or the like.

An object of the present invention is to provide an edge incident type light receiving element unit capable of receiving optical signals in different wavelength ranges incident from the edge side.

Means to Solve the Problems

The present invention presents a light receiving element unit comprising a first light receiving element having a first light receiving portion for receiving optical signals in a first wavelength range and a second light receiving element having a second light receiving portion for receiving optical signals in a second wavelength range, and configured so that optical signals transmitted through the first light receiving portion are incident on the second light receiving portion; wherein the first light receiving element comprises a first semiconductor substrate, a wall portion erected on the first semiconductor substrate, and the first light receiving portion formed on the wall portion, the second light receiving element is an edge incident type light receiving element comprising a second semiconductor substrate, the second light receiving portion formed on a main surface side of the second semiconductor substrate, a reflecting portion that reflects optical signals incident from an edge surface of the second semiconductor substrate toward the second light receiving portion, and the second light receiving element is arranged so that the edge surface faces the wall portion.

According to the above configuration, light signals are incident on the first light receiving portion formed on the wall portion of the first light receiving element. And the light signals transmitted through the first light receiving portion are incident on the edge surface of the edge incident type second light receiving element toward the reflecting portion of the second light receiving element, then the light signals reflected by the reflecting portion are incident on the second light receiving portion. As a result, the first light receiving portion converts optical signals in the first wavelength range included in the incident optical signals into electric signals, and the second light receiving portion converts optical signals in the second wavelength range into electric signals. Therefore, the light receiving element unit can receive optical signals in different wavelength ranges that are emitted in parallel with the mounting board of the light receiving element unit and incident from the edge side of the light receiving element unit. Accordingly, it is not necessary to stand the light receiving element unit on the mounting board to face the incident direction of optical signals, and the wiring connection is easy.

In a preferable first aspect of the present invention, the first light receiving element comprises a first accommodating portion adjacent to the wall portion and formed by reducing a thickness of the first semiconductor substrate by a height of the wall portion, and the second light receiving element is accommodated in the first accommodating portion.

According to the above configuration, by the first accommodating portion, the position of the second light receiving element with respect to the first light receiving portion in the height direction of the wall portion is determined. Therefore, the second light receiving element can be easily arranged so that light signals transmitted through the first light receiving portion are incident on the second light receiving portion.

In a preferable second aspect of the present invention, the first light receiving element comprises a second accommodating portion adjacent to the wall portion and formed by reducing the thickness of the first semiconductor substrate by the height of the wall portion, and an optical fiber cable for emitting optical signals toward the first light receiving portion is accommodated in the second accommodating portion.

According to the above configuration, by the second accommodating portion, the position of the exit end of the optical fiber cable in the height direction of the wall portion with respect to the first light receiving portion can be determined. Therefore, the optical fiber cable can be easily arranged so that the optical signals transmitted through the first light receiving portion are incident on the second light receiving portion.

In a preferable third aspect of the present invention, the second accommodating portion is formed to be a groove shape for fixing the optical fiber cable. According to the above configuration, the position of the output end of the optical fiber cable can be easily determined and fixed.

Advantages of the Invention

According to the light receiving element unit of the present invention, it is possible to receive optical signals in different wavelength ranges incident from the edge side of the light receiving element unit. Therefore, it is not necessary to stand the light receiving element unit on the mounting board to face in the incident direction of optical signals, and the wiring connection become easy.

DESCRIPTION OF EMBODIMENTS

Now, the present invention will be explained based on an embodiment thereof.

First Embodiment

Figure 1:
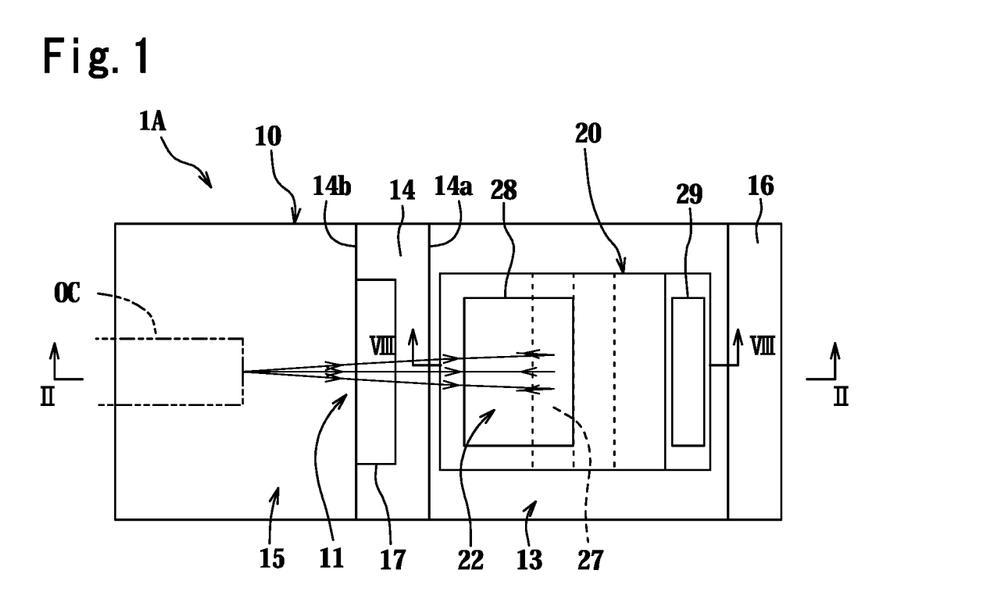
FIG. 1 is a plan view of a main part of a light receiving element unit according to a first embodiment of the present invention.
Figure 2:
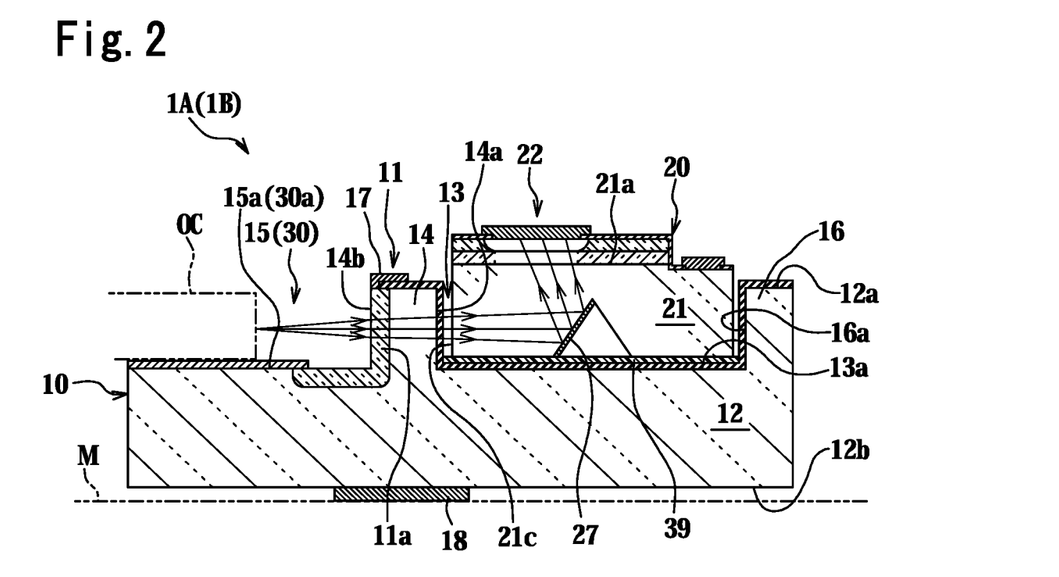
FIG. 2 is a sectional view of a main part taken along line II-II of FIG. 1.

As shown in FIG. 1 and FIG. 2, a light receiving element unit 1A fixed to a mounting board M has a first light receiving element 10 for receiving optical signals in a first wavelength range and a second light receiving element 20 for receiving optical signals in a second wavelength range. The second wavelength range is set to a wavelength range having longer wavelength than the first wavelength range. For example, the first wavelength range is 400 to 1100 nm and the second wavelength range is 1000 to 1700 nm. Optical signals having a wavelength of, for example, 850 nm in the first wavelength range and a wavelength of, for example, 1550 nm in the second wavelength range are simultaneously emitted from an output end of an optical fiber cable OC.

The optical signals emitted from the optical fiber cable OC arranged parallel to the mounting board M are incident on a first light receiving portion 11 of the first light receiving element 10, and the optical signals in the first wavelength range are converted into electric signals and output. Further, the light signals transmitted through the first light receiving portion 11 are incident on the second light receiving element 20, and reflected by a reflecting portion 27 of the second light receiving element 20 toward a second light receiving portion 22, and incident on the second light receiving portion 22. Then, the optical signals in the second wavelength range are converted into electric signals and output.

The first light receiving element 10 will be described.

The first light receiving element 10 has, for example, an n-Si substrate whose surface 12a is a (110) plane as a first semiconductor substrate 12, and a wall portion 14 erected on the first semiconductor substrate 12. Further, the first light receiving element 10 has a first accommodating portion 13 and a second accommodating portion 15 adjacent to each other with separated by the wall portion 14.

The first accommodating portion 13 and the second accommodating portion 15 are formed by indenting predetermined regions of the first semiconductor substrate 12 by etching from the front surface 12a toward a back surface 12b. The wall portion 14 is formed by leaving it unetched. Therefore, in the first accommodating portion 13 and the second accommodating portion 15, the thickness of the first semiconductor substrate 12 is reduced by the height of the wall portion 14. In addition, the first accommodating portion 13 and the second accommodating portion 15 may be formed by machining to cut or grind the first semiconductor substrate 12. In this case, the first and second accommodating portions 13 and 15 can be formed regardless of the crystal orientation of the first semiconductor substrate 12.

The optical fiber cable OC is accommodated in the second accommodating portion 15 so that the output end of the optical fiber cable OC emits optical signals toward the first light receiving portion 11. The second light receiving element 20 is accommodated in the first accommodating portion 13. Although the depths of the first accommodating portion 13 and the second accommodating portion 15 are the same, they may be formed to be different depths.

A side surface 14a of the wall portion 14 facing the first accommodating portion 13 is a (111) plane of the first semiconductor substrate 12 and is orthogonal to the front surface 12a of the first semiconductor substrate 12. A bottom portion 13a of the first accommodating portion 13 is a (110) plane of the first semiconductor substrate 12 and is parallel to the front surface 12a of the first semiconductor substrate 12. A side surface 14b of the wall portion 14 facing the second accommodating portion 15 is a (111) plane of the first semiconductor substrate 12 and parallel to the side surface 14a and orthogonal to the front surface 12a of the first semiconductor substrate 12. The side surface 14b is an incident surface of optical signals incident on the first light receiving portion 11, and the side surface 14a is an emitting surface of optical signals of the light passed through the first light receiving portion 11 toward the second light receiving element 20.

A bottom portion 15a of the second accommodating portion 15 is a (110) plane of the first semiconductor substrate 12 and is parallel to the front surface 12a of the first semiconductor substrate 12. On the opposite side of the first accommodating portion 13 to the wall portion 14, a second wall portion 16 having a side surface 16 parallel to the side surface 14a of the wall portion 14 is formed, but the second wall portion 16 may be omitted.

The first light receiving portion 11 is a photodiode formed in parallel to the side surface 14a, 14b of the wall portion 14, that has a pn junction between a first p-type diffusion region 11a formed on the second accommodating portion 15 side of the wall portion 14 and the first semiconductor substrate 12. The first light receiving portion 11 may be a photodiode in which a first p-type diffusion region 11a is formed on the first accommodating portion 13 side of the wall portion 14.

The first light receiving portion 11 has a first anode electrode 17 connected to the first p-type diffusion region 11a on the front surface 12a side of the first semiconductor substrate 12, and a first cathode electrode 18 connected to the first semiconductor substrate 12 on the back surface 12b side of the first semiconductor substrate 12. The first cathode electrode 18 can also be formed on the surface 12a side of the first semiconductor substrate 12. The first anode electrode 17 and the first cathode electrode 18 are formed by selectively depositing metals containing, for example, aluminum or gold. Although not shown, the first anode electrode 17 is connected to the wiring of the mounting board M by, for example, wire bonding, and the first cathode substrate 18 is connected to the other wiring of the mounting board M, by conductive paste.

Although not shown, the first semiconductor substrate 12 on the side surface 14a side of the wall portion 14 can be separated for omitting the first accommodating portion 13 by dicing, for example, or the first semiconductor substrate on the side surface 14b side of the wall portion 14 can be separated for omitting the second accommodating portion 15 by dicing, for example. It is also possible to separate the first semiconductor substrates 12 on the side surfaces 14a and 14b of the wall portion 14 by dicing, and omit the first and second accommodating portions 13 and 15. When the first accommodating portion 13 is omitted, the second light receiving element 20 is fixed to the mounting board M via, for example, a spacer (not shown) for height adjustment. When the second accommodating portion 15 is omitted, the optical fiber cable OC is fixed to the mounting board M by, for example, a height-adjustable fixture (not shown).

The manufacturing process of the first light receiving element 1A will be described.

Figure 3:
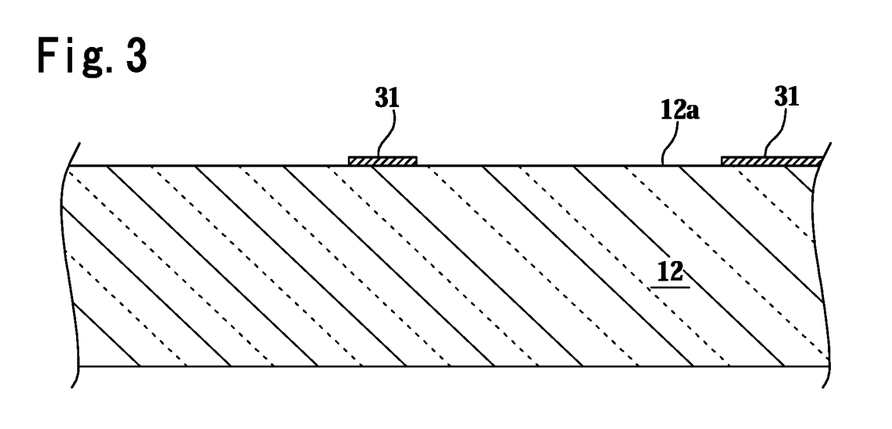
FIG. 3 is a diagram showing accommodating portions etching mask formation step of the first light receiving element.

As shown in FIG. 3, an etching mask 31 for forming the first accommodating portion 13 and the second accommodating portion 15 is formed on the surface 12a of the first semiconductor substrate 12 in the wafer state (accommodating portion etching mask forming step).

Figure 4:
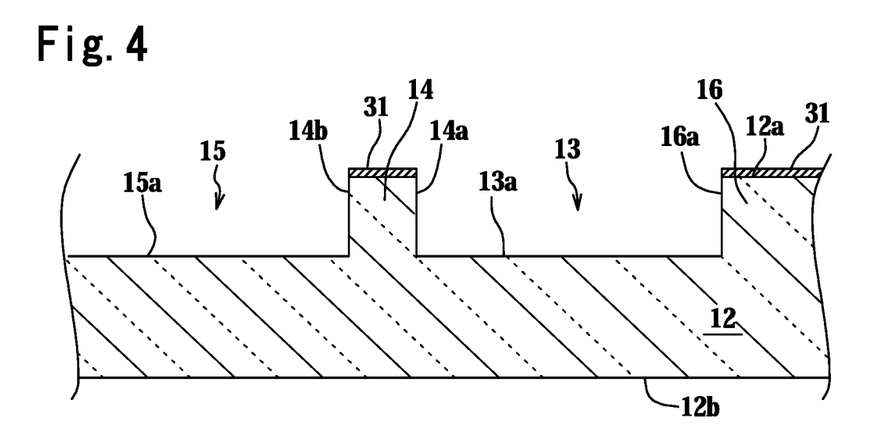
FIG. 4 is a diagram showing accommodating portions forming step of the first light receiving element.

Then, as shown in FIG. 4, the first semiconductor substrate 12 is recessed from the front surface 12a toward the back surface 12b by anisotropic etching using a known etching solution such as a KOH aqueous solution, thereby the first accommodating portion 13 and the second accommodating portion 15 are formed (accommodating portion forming step). At this time, the depths of the first and second accommodating portions 13 and 15 can be adjusted by the etching time, and the {111} planes having a slow etching rate orthogonal to the surface 12a is exposed. Although not shown, the first and second accommodating portions 13 and 15 are part of recesses formed in a parallelogram by the {111} planes when viewed from the surface 12a side, respectively.

Figure 5:
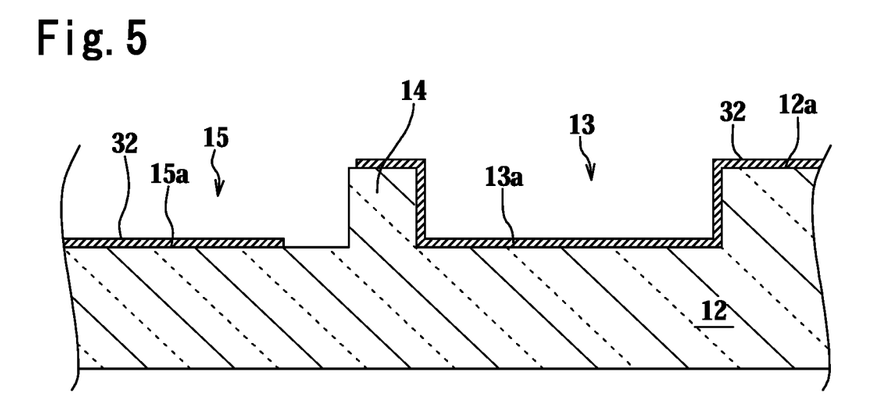
FIG. 5 is a diagram showing a first diffusion mask forming step of the first light receiving element.
Figure 6:
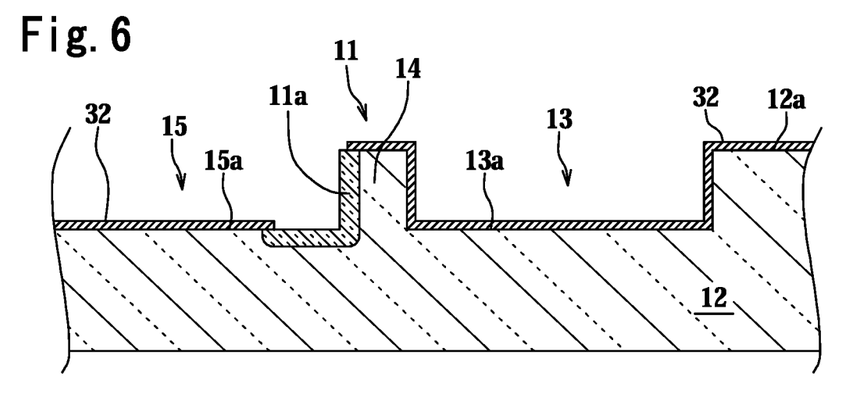
FIG. 6 is a diagram showing a first diffusion region forming step of the first light receiving element.

After removing the etching mask 31, as shown in FIG. 5, a first diffusion mask 32 is formed in which a part of the side surface 14b of the wall portion 14 on the second accommodating portion 15 side and a part of the bottom portion 15a of the second accommodating portion 15 are exposed (diffusion mask formation process). Then, for example, using a doping paste containing boron as a dopant, as shown in FIG. 6, the first p-type diffusion region 11a is formed in a part of the side surface 14b side of the wall portion 14 and a part of the bottom portion 15a of the second accommodating portion 15 (first diffusion region forming step).

Figure 7:
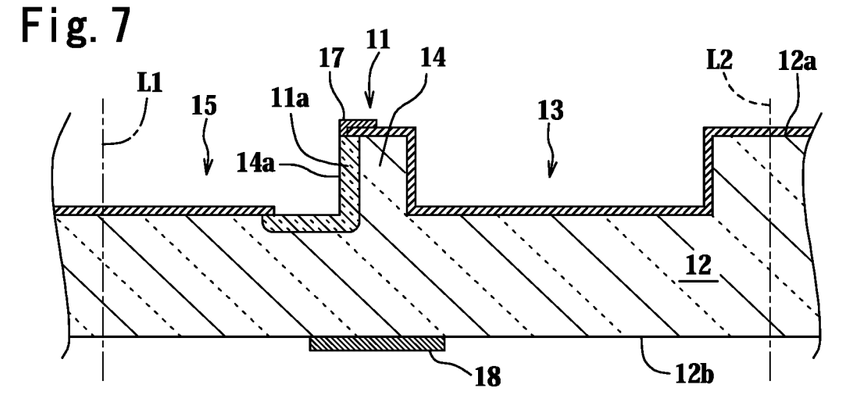
FIG. 7 is a diagram showing first electrodes forming step of the first light receiving element.

Next, as shown in FIG. 7, the anode electrode 17 connected to the first p-type diffusion region 11a is formed on the front surface 12a side of the first semiconductor substrate 12, and the first cathode electrode 18 connected to the first semiconductor substrate 12 is formed on the back surface 12b side of the first semiconductor substrate 12 (first electrode forming step). Then, for example, as shown by the alternate long and short dash lines L1 and L2, the first light receiving element 1A of FIG. 1, 2 is obtained by a first dicing step of dicing with a dicing blade in a direction parallel to the side surface 14b and a direction orthogonal to the side surface 14b. The first p-type diffusion region 11a and the back surface 12b of the first semiconductor substrate 12 may be covered with a dielectric film, and the dielectric film covering the first p-type diffusion region 11a may be an antireflection film such as a SiN film.

Next, the second light receiving element 20 will be described.

Figure 8:
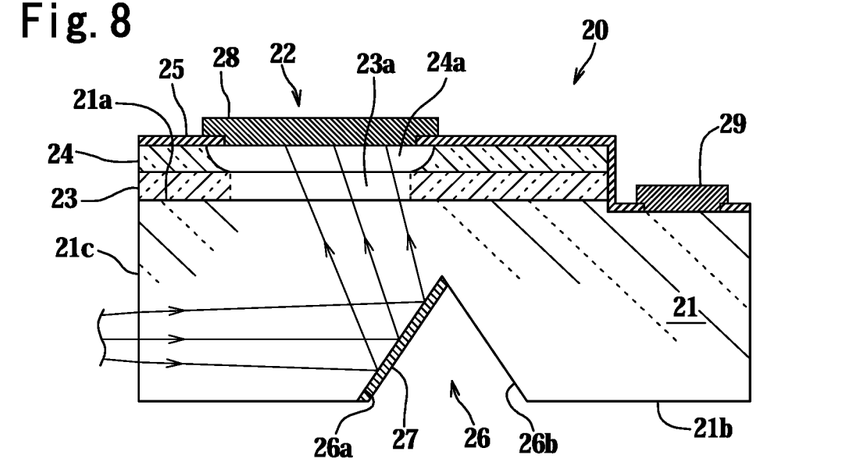
FIG. 8 is an enlarged sectional view of the main portion of the second light receiving element of FIG. 2.

FIG. 8 shows an enlarged view of the second light receiving element 20 of FIG. 2. The second light receiving element 20 is an edge incident type semiconductor light receiving element having a second semiconductor substrate 21, a light receiving portion 22 formed on the main surface 21a side of the second semiconductor substrate 21, and a reflecting portion 27 that reflects light signals incident from the edge surface 21c of the second semiconductor substrate 21 toward the light receiving portion 22. The light signal incident from the edge surface 21c is reflected by the reflecting portion 27 and incident on the second light receiving portion 22.

On the main surface 21a side of the second semiconductor substrate 21, for example, an InGaAs layer as the first semiconductor layer 23 and an n-InP layer as the second semiconductor layer 24 are laminated. A second p-type diffusion region 24a is formed in a predetermined region of the second semiconductor layer 24, and the region of the first semiconductor layer 23 in contact with the second p-type diffusion region 24a corresponds to the light absorption region 23a. The second light receiving portion 22 is a photodiode having a second p-type diffusion region 24a and a light absorption region 23a.

The reflecting portion 27 is formed by forming, for example, a metal film mainly containing gold in a groove portion 26 extending in a direction parallel to the edge surface 21c on the back surface 21b side of the second semiconductor substrate 21. The groove portion 26 has inclined surfaces 26a and 26b which are {111} planes of the second semiconductor substrate 21. The smooth reflecting portion 27 having a constant intersection angle (54.7 degrees) with respect to the main surface 21a is formed on the inclined surface 26a on the edge surface 21c side on which the optical signal is incident, and the reflecting portion 27 has a high reflectance.

In order to output the electric signal converted by the second light receiving portion 22, a second anode electrode 28 connected to the second p-type diffusion region 24a and a second cathode electrode 29 connected to the second semiconductor substrate 21 are formed on the main surface 21a side of the second semiconductor substrate 21. The second anode electrode 28 and the second cathode electrode 29 are formed by selectively depositing a metal containing, for example, aluminum or gold.

Figure 9:
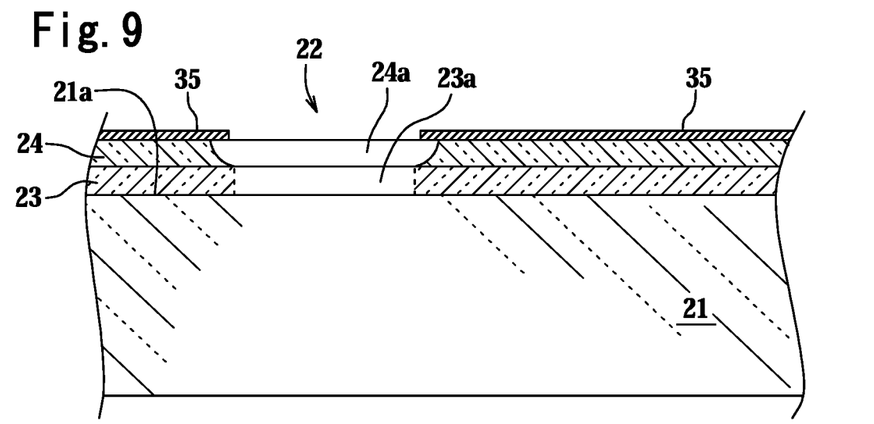
FIG. 9 is a diagram showing a second diffusion region formation step of the second light receiving element.

The manufacturing process of the second light receiving element 20 will be described. As shown in FIG. 9, after forming the first semiconductor layer 23 and the second semiconductor layer 24 on the main surface 21a side of the second semiconductor substrate 21 in the state of a wafer, a second diffusion mask 35 for forming a second p-type diffusion region 24a was formed on the second semiconductor layer 24, and, for example, zinc was diffused as a dopant (diffusion region formation step). The region of the first semiconductor layer 23 in contact with the second p-type diffusion region 24a corresponds to the light absorption region 23a, and the second light receiving portion 22 having the second p-type diffusion region 24a and the light absorption region 23a is formed.

Figure 10:
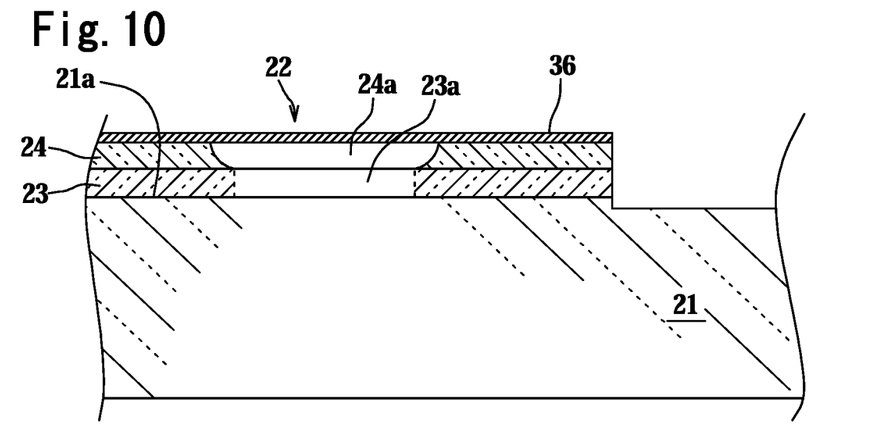
FIG. 10 is a diagram showing a semiconductor layers etching step of the second light receiving element.
Figure 11:
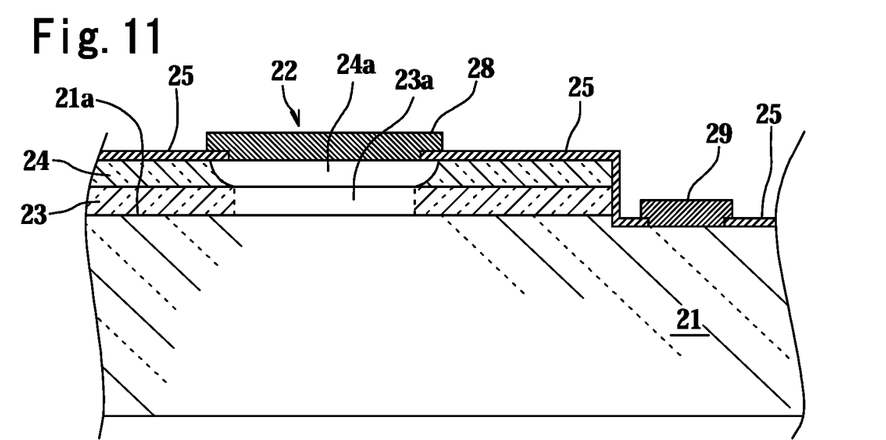
FIG. 11 is a diagram showing second electrodes forming step of the second light receiving element.

After removing the second diffusion mask 35, as shown in FIG. 10, a semiconductor layer etching mask 36 is formed, and the second semiconductor layer 24 and the first semiconductor layer 23 are removed so that a predetermined region of the second semiconductor substrate 21 is exposed (semiconductor layer etching step). Then, after removing the semiconductor layer etching mask 36, as shown in FIG. 11, an opening is formed in the dielectric film 25 covering the main surface 21a side of the second semiconductor substrate 21, and the second anode electrode 28 connected to the second p-type diffusion region 24a and a second cathode electrode 29 connected to the second semiconductor substrate 21 are formed (second electrode forming step).

Figure 12:
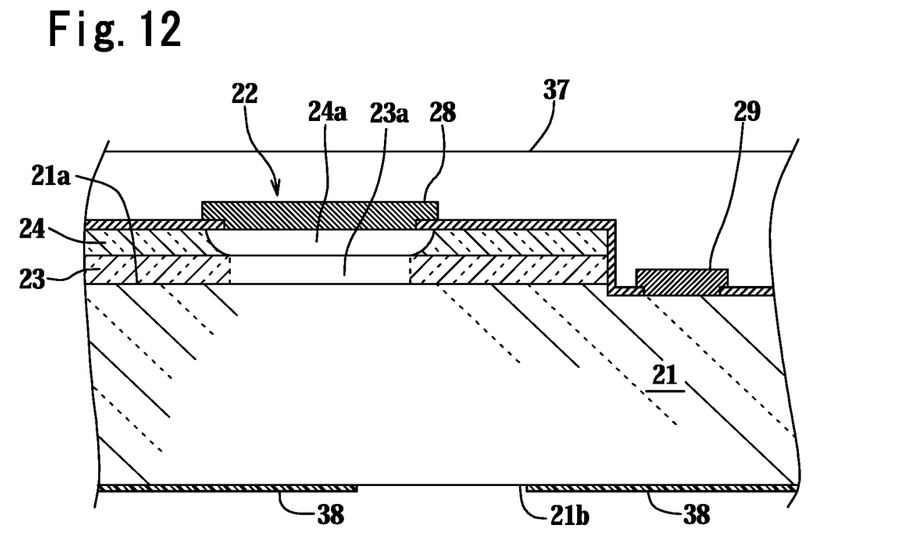
FIG. 12 is a diagram showing a groove portion etching mask forming step of the second light receiving element.
Figure 13:
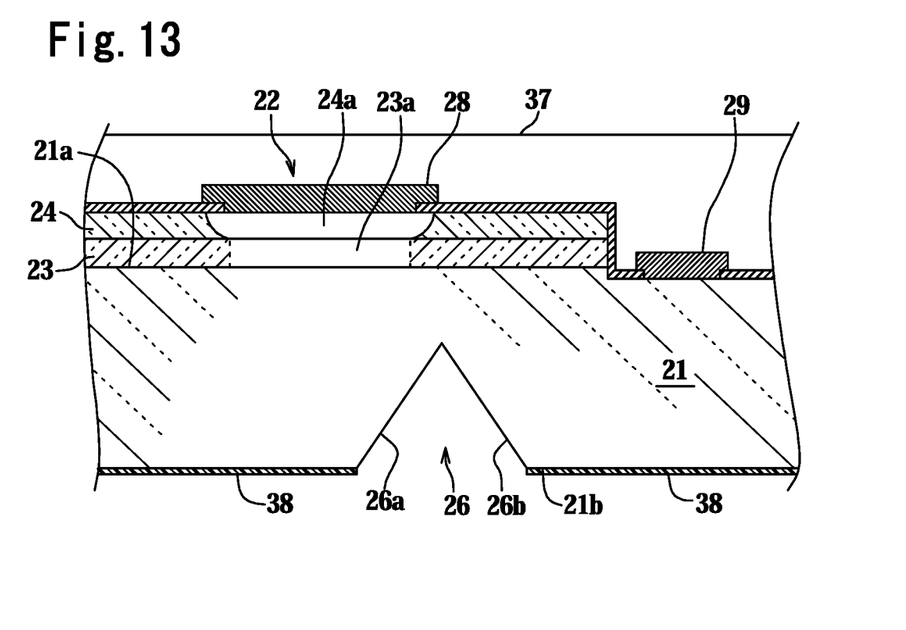
FIG. 13 is a diagram showing a groove portion forming step of the second light receiving element.

Next, as shown in FIG. 12, the main surface 21a side of the second semiconductor substrate 21 is covered with a thickly deposited protective film 37 such as a photoresist, and formed a groove etching mask 38 having an opening corresponding to the second light receiving portion 22 on the back surface 21b of the second semiconductor substrate 21 (groove etching mask forming step). Then, as shown in FIG. 13, for example, by known anisotropic etching using a mixed solution of hydrogen bromide and methanol, a groove portion 26 having an inclined surfaces 26a, 26b which are {111} planes of the second semiconductor substrate 21 is formed on the back surface 21b side of the second semiconductor substrate 21 (groove portion forming step).

Figure 14:
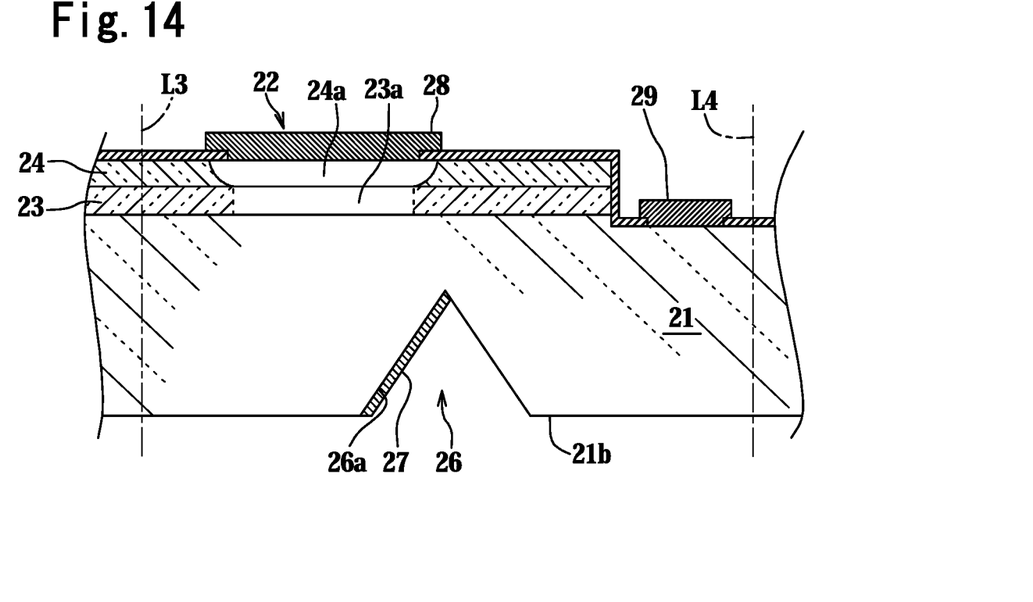
FIG. 14 is a diagram showing a reflecting portion forming step of the second light receiving element.

After removing the groove etching mask 38, as shown in FIG. 14, a reflective film mainly containing, for example, gold is selectively deposited on the inclined surface 26a to form a reflecting portion 27 that reflects toward the second light receiving portion 22 (reflective part forming step). Then, the protective film 37 is removed, for example, the second light receiving element 20 of FIG. 8 is obtained by a second dicing step of dicing using a dicing blade in a direction in which the groove portion 26 extends along the alternate long and short dash lines L3 and L4 and in a direction orthogonal to the groove portion 26. The back surface 21b of the second semiconductor substrate 21 may be covered with a dielectric film.

The light receiving element unit 1A is formed by accommodating the second light receiving element 20 in the first accommodating portion 13 so that the edge surface 21c of the second light receiving element 20 faces the side surface 14a of the wall portion 14 of the first light receiving element 10, and is fixed by, for example, an adhesive. This light receiving element unit 1A is fixed to the mounting board M. In the case where the first accommodating portion 13 is omitted, in order to make the light signal transmitted through the first light receiving portion 11 incident on the second light receiving portion 22, the second light receiving element 20 uses a spacer for height adjustment on the mounting board M to which the first light receiving element 10 is fixed so that the edge surface 21c faces the side surface 14a of the wall portion 14 of the first light receiving element 10.

The first and second anode electrodes 17 and 28 and the first and second cathode electrodes 18 and 29 are connected to the corresponding wiring (not shown) formed on the mounting board M by wire bonding. Then, by fixing the optical fiber cable OC in a state where the output end of the optical fiber cable OC is accommodated in the second accommodating portion 15 toward the wall portion 14, the light receiving element unit 1A can receive optical signals in different wavelength ranges incident from the edge side. The position of the output end of the optical fiber cable OC is set so that all of the incident light can be incident on the second light receiving unit 22 in consideration of the divergence angle of the optical signal.

Second Embodiment

A light receiving element unit 1B which is a partial modification of the first embodiment will be described. The same reference numerals are given to the parts common to those in the first embodiment, and the description thereof will be omitted.

Figure 15:
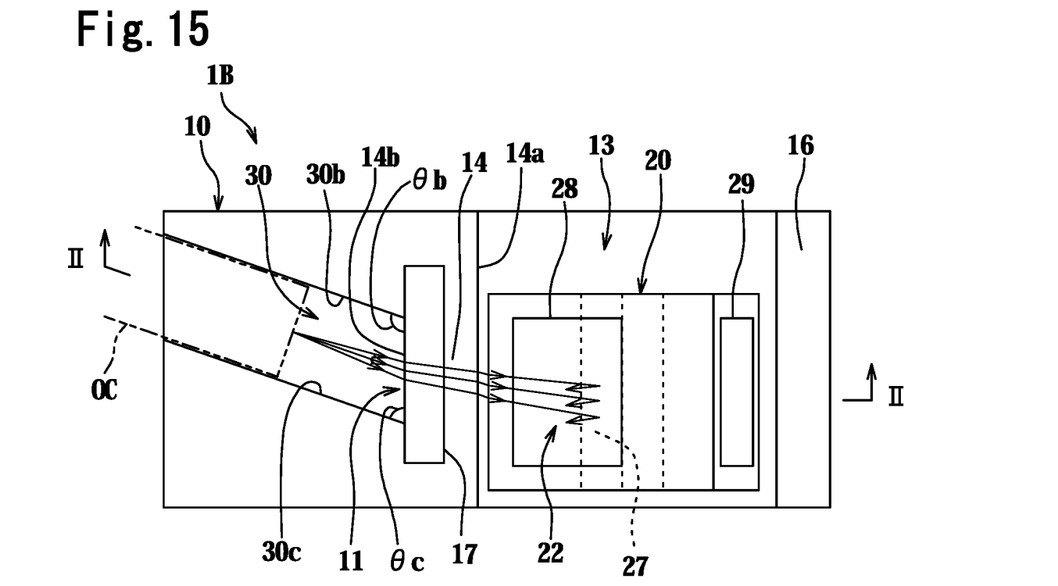
FIG. 15 is a plan view of a main part of a light receiving element unit according to a second embodiment of the present invention.

As shown in FIGS. 15 and 2, the light receiving element unit 1B causes the optical signal emitted from the optical fiber cable OC to enter the first light receiving portion 11 of the first light receiving element 10, and causes the light transmitted through the first light receiving portion 11 to enter the second light receiving element 20. Then, the light signal incident on the second light receiving element 20 is reflected by the reflecting portion 27 of the second light receiving element 20 toward the second light receiving portion 22, and is configured to be incident on the second light receiving portion 22.

The first light receiving element 10 has, for example, an n-Si substrate whose surface 12a is a (110) plane as the first semiconductor substrate 12, and a wall portion 14 vertically arranged on the first semiconductor substrate 12. Further, the first light receiving element 10 has a first accommodating portion 13 and a second accommodating portion 30 adjacent to each other with separated by the wall portion 14. The second accommodating portion 30 is formed in a groove shape having a predetermined groove width, one end side in the direction in which the groove extends communicates with the outside, and the first light receiving portion 11 is formed on the wall portion 14 on the other end side.

The first accommodating portion 13 and the second accommodating portion 30 are formed by indenting a predetermined region of the first semiconductor substrate 12 by etching from the front surface 12a to the back surface 12b, and the wall portion 14 is formed by leaving the wall portion 14 unetched. In the first accommodating portion 13 and the second accommodating portion 30, the thickness of the first semiconductor substrate 12 is reduced by the height of the wall portion 14. It is also possible to omit the first accommodating portion 13.

The groove width of the groove-shaped second accommodating portion 30 is formed to be, for example, about the diameter of the optical fiber cable OC, and the output end of the optical fiber cable OC is accommodated in the second accommodating portion 30. The second light receiving element 20 is accommodated in the first accommodating unit 13.

The groove-shaped second accommodating portion 30 is surrounded by three side surfaces, each of which is the (111) plane of the first semiconductor substrate 12. The side surface 14b of the wall portion 14 on the second accommodating portion 30 side is the (111) plane of the first semiconductor substrate 12 and is orthogonal to the surface 12a of the first semiconductor substrate 12.

The parallel side surfaces 30b and 30c of the second accommodating portion 30 facing in the groove width direction are connected to the side surface 14b of the wall portion 14 at angles of θ b=109.4 degrees and θ c=70.6 degrees, respectively. Therefore, in the optical signal emitted parallel to the surface 12a from the output end of the optical fiber cable OC accommodated in the second accommodating portion 30 toward the first light receiving portion 11, the optical axis is incident on the first light receiving portion 11 at incident angle of 19.4 degrees when viewed from the surface side 12a.

The bottom portion 30a of the first accommodating portion 30 is the (110) plane of the first semiconductor substrate 12 and is parallel to the surface 12a of the first semiconductor substrate 12. The side surface 14a of the wall portion 14 on the first accommodating portion 13 side is the (111) plane of the first semiconductor substrate 12 parallel to the side surface 14b of the wall portion 14, and is orthogonal to the surface 12a of the first semiconductor substrate 12. The bottom portion 13a of the first accommodating portion 13 is the (110) plane of the first semiconductor substrate 12 and is parallel to the surface 12a of the first semiconductor substrate 12. On the side of the first accommodating portion 13 opposite to the wall portion 14, a second wall portion 16 having a surface parallel to the side surface 14a of the wall portion 14 is formed, but the second wall portion 16 may be omitted.

The optical signal transmitted through the first light receiving portion 11 is incident on the edge surface 21c of the second light receiving element 20 accommodated in the first accommodating portion 13. The light receiving element unit 1B is formed by accommodating the second light receiving element 20 in the first accommodating portion 13 so that the edge surface 21c of the second light receiving element 20 faces the side surface 14a of the wall portion 14 of the first light receiving element 10, and is fixed by, for example, an adhesive. The light receiving element unit 1B is fixed to the mounting board M.

The first and second anode electrodes 17 and 28 and the first and second cathode electrodes 18 and 29 are connected to the corresponding wiring (not shown) formed on the mounting board M by wire bonding. Then, by fixing the optical fiber cable OC in a state where the output end of the optical fiber cable OC is accommodated in the accommodating portion 30 toward the first light receiving portion 11, the light receiving element unit 1B can receive optical signals in different wavelength ranges that are incident parallel to the mounting board M from the edge side of the light receiving element unit 1B.

Considering that the optical signal is incident on the reflecting portion 27 at an angle of about 6 degrees in a plane parallel to the main surface 21a of the semiconductor substrate 21, the position of the second light receiving element 20 in the first accommodating portion 13 is set so that the light signal is incident on the second light receiving portion 22. The position of the output end of the optical fiber cable OC is set so that all of the incident light can be incident on the second light receiving portion 22 in consideration of the divergence angle of the optical signal.

In the manufacturing process of the first light receiving element 10, the opening shape of the etching mask 31 in the accommodating portion etching mask forming step of the first embodiment may be changed, and the manufacturing process of the second light receiving element 20 will be omitted because of the same as that of the first embodiment.

The actions and effects of the light receiving element units 1A and 1B according to the first and second embodiments will be described.

The light receiving element units 1A and 1B make an optical signal incident on the first light receiving portion 11 formed on the wall portion 14 of the first light receiving element 10 from the optical fiber cable OC arranged on the side surface 14b side of the wall portion 14. Then, the light transmitted through the first light receiving portion 11 is incident on the reflecting portion 27 from the edge surface 21c of the edge incident type second light receiving element 20, and the light signal reflected by the reflecting portion 27 is incident on the second light receiving portion 22. The first light receiving portion 11 converts the optical signal in the first wavelength range included in the incident optical signal into an electric signal, and the second light receiving portion 22 converts the optical signal in the second wavelength range into an electric signal.

Thus, the light receiving element unit 1A, 1B can receive optical signals in different wavelength ranges that are emitted in parallel with the mounting board M of the light receiving element unit 1A, 1B and is incident from the edge sides of the light receiving element unit 1A, 1B. Therefore, it is not necessary to stand the light receiving element units 1A, 1B on the mounting board M in the incident direction of the optical signal, and the wiring connection becomes easy.

The first light receiving element 10 has a first accommodating portion 13 in which the thickness of the first semiconductor substrate 12 is made thin by the height of the wall portion 14 at a position adjacent to the wall portion 14, and the second light receiving element 20 is accommodated in the first accommodating portion 13. The first accommodating portion 13 determines the position of the second light receiving element 20 in the height direction of the wall portion 14 with respect to the first light receiving portion 11. Therefore, the position adjustment direction of the second light receiving element 20 is limited to a direction other than the height direction of the wall portion 14, and the light signal transmitted through the first light receiving portion 11 can be arranged so as to be incident on the second light receiving portion 22.

The first light receiving element 10 has the second accommodating portion 15 (30) whose thickness of the first semiconductor substrate 12 is made thin by the height of the wall portion 14 at a position adjacent to the wall portion 14, the optical fiber cable OC that emits an optical signal toward the first light receiving portion 11 is accommodated in the second accommodating portion 15 (30). The second accommodating portion 15 (30) determines the position of the output end of the optical fiber cable OC in the height direction of the wall portion 14 with respect to the first light receiving portion 11. Therefore, the direction of adjusting the position of the optical fiber cable OC is limited to a direction other than the height direction of the wall portion 14, and the optical signal transmitted through the first light receiving portion 11 can be easily arranged so as to be incident on the second light receiving portion 22.

Further, the second accommodating portion 30 is formed in a groove shape for fixing the optical fiber cable OC. Therefore, the direction of adjusting the position of the optical fiber cable OC is limited to the direction of changing the distance from the first light receiving portion 11, and the position can be easily determined and fixed so that the optical signal transmitted through the first light receiving portion 11 is incident on the second light receiving portion 22.

In addition, a person skilled in the art can carry out the embodiment in a form in which various modifications are added to the above embodiment without departing from the spirit of the present invention, and the present invention also includes such modified forms.

DESCRIPTION OF REFERENCE NUMERALS 1A, 1B: light receiving element unit
10: first light receiving element
11: first light receiving portion
11a: first p-type diffusion region
12: first semiconductor substrate
12a: front surface
13: first accommodating portion
14: wall portion
15, 30: second accommodating portion
17: first anode electrode
18: first cathode electrode
20: second light receiving element
21: second semiconductor substrate
21a: main surface
21b: back surface
21c: edge surface
22: second light receiving portion
23: first semiconductor layer
23a: light absorption region
24: second semiconductor layer
24a: second p-type diffusion region
25: dielectric film
26: groove portion
27: reflecting portion
28: second anode electrode
29: second cathode electrode
31: etching mask
32: first diffusion mask
35: second diffusion mask
36: semiconductor layer etching mask
37: protective film
38: groove etching mask
M: mounting board
OC: optical fiber cable

The invention claimed is:

1. A light receiving element unit comprising a first light receiving element having a first light receiving photodiode for receiving optical signals in a first wavelength range and a second light receiving element having a second light receiving photodiode for receiving optical signals in a second wavelength range, and configured so that optical signals transmitted through the first light receiving photodiode are incident on the second light receiving photodiode; wherein the first light receiving element comprises a first semiconductor substrate, a wall portion erected integrally with the first semiconductor substrate, and the first light receiving photodiode formed on the wall portion, the second light receiving element is an edge incident type light receiving element comprising a second semiconductor substrate, the second light receiving photodiode formed on a main surface side of the second semiconductor substrate, a reflecting portion that reflects optical signals incident from an edge surface of the second semiconductor substrate toward the second light receiving photodiode, and the second light receiving element is arranged so that the edge surface faces the wall portion.

2. The light receiving element unit according to claim 1; wherein the first light receiving element comprises a first accommodating portion adjacent to the wall portion and formed by reducing a thickness of the first semiconductor substrate by a height of the wall portion, and the second light receiving element is accommodated in the first accommodating portion.

3. The light receiving element unit according to claim 1 or 2; wherein the first light receiving element comprises a second accommodating portion adjacent to the wall portion and formed by reducing the thickness of the first semiconductor substrate by the height of the wall portion, and an optical fiber cable for emitting optical signals toward the first light receiving photodiode is accommodated in the second accommodating portion.

4. The light receiving element unit according to claim 3; wherein the second accommodating portion is formed to be a groove shape for fixing the optical fiber cable.

* * * * *